(12) United States Patent
Park et al.

(10) Patent No.: US 12,082,470 B2
(45) Date of Patent: Sep. 3, 2024

(54) STRETCHABLE DISPLAY DEVICE

(71) Applicant: Samsung Display Co., Ltd., Yongin-si (KR)

(72) Inventors: Gwui-Hyun Park, Hwaseong-si (KR); Chul Won Park, Hwaseong-si (KR); Pil Soon Hong, Gwangmyeong-si (KR); Bo Geon Jeon, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/490,321

(22) Filed: Oct. 19, 2023

(65) Prior Publication Data

US 2024/0049540 A1  Feb. 8, 2024

Related U.S. Application Data

(63) Continuation of application No. 18/109,941, filed on Feb. 15, 2023, now Pat. No. 11,800,765, which is a continuation of application No. 17/181,206, filed on Feb. 22, 2021, now Pat. No. 11,594,591, which is a continuation of application No. 16/261,922, filed on Jan. 30, 2019, now Pat. No. 10,964,769.

(30) Foreign Application Priority Data

Mar. 8, 2018  (KR) .................. 10-2018-0027477

(51) Int. Cl.
H10K 59/131  (2023.01)
H10K 59/121  (2023.01)
H10K 77/10  (2023.01)

(52) U.S. Cl.
CPC ....... *H10K 59/131* (2023.02); *H10K 59/1213* (2023.02); *H10K 77/111* (2023.02)

(58) Field of Classification Search
CPC ............ H10K 59/131; H10K 59/1213; H10K 77/111; H10K 59/124; H10K 50/80; H10K 59/12; H10K 59/121; H10K 59/123; Y02E 10/549; G09F 9/301
See application file for complete search history.

(56) References Cited

U.S. PATENT DOCUMENTS 9,391,286 B1 *  7/2016  Kwon ................. H10K 50/844
9,844,133 B2 * 12/2017  Tomita ................... H05K 1/038
10,026,721 B2 *  7/2018  Kim ....................... H01L 25/167
(Continued)

FOREIGN PATENT DOCUMENTS

JP          4637451       2/2011
KR    10-2016-0088522    7/2016
(Continued)

*Primary Examiner* — Caleb E Henry
(74) *Attorney, Agent, or Firm* — KILE PARK REED & HOUTTEMAN PLLC

(57) ABSTRACT

A stretchable display device includes a stretchable substrate including a plurality of island areas that are separated from each other and a hinge area connecting the plurality of island areas, a plurality of display units respectively located in each of the plurality of island areas, a wiring part connecting the plurality of display units and located at the hinge area, and an insulating layer between the stretchable substrate and the plurality of display units. The insulating layer includes an opening overlapping the hinge area.

15 Claims, 8 Drawing Sheets

(56) References Cited

U.S. PATENT DOCUMENTS

| | | |
|---|---|---|
| 10,068,951 B2 | 9/2018 | Choi et al. |
| 10,310,560 B2 * | 6/2019 | Choi ................. H05B 33/14 |
| 10,580,837 B2 | 3/2020 | Choi et al. |
| 10,608,071 B2 * | 3/2020 | Hong ................. H10K 59/131 |
| 10,649,496 B2 * | 5/2020 | Choi ................. H10K 59/131 |
| 10,943,958 B2 | 3/2021 | Choi et al. |
| 2003/0134488 A1 * | 7/2003 | Yamazaki ........ G02F 1/133305 438/455 |
| 2004/0192082 A1 * | 9/2004 | Wagner ................. H05K 1/11 439/67 |
| 2010/0330338 A1 * | 12/2010 | Boyce ................. H01L 23/4985 428/156 |
| 2012/0103683 A1 * | 5/2012 | Ishida ................. H05K 1/038 87/8 |
| 2013/0256921 A1 * | 10/2013 | Huang ................. H01L 23/528 257/786 |
| 2014/0299362 A1 * | 10/2014 | Park ................. H05K 1/0283 174/254 |
| 2015/0189741 A1 * | 7/2015 | Hong ................. H05K 1/0283 427/372.2 |
| 2016/0181346 A1 * | 6/2016 | Kwon ................. H10K 59/131 257/40 |
| 2016/0268352 A1 * | 9/2016 | Hong ................. H10K 59/131 |
| 2016/0343866 A1 * | 11/2016 | Koezuka ........... H01L 29/78696 |
| 2016/0365393 A1 * | 12/2016 | Kim ................. H10K 59/50 |
| 2017/0033323 A1 * | 2/2017 | Chida ................. H10K 71/40 |
| 2017/0139442 A1 * | 5/2017 | Yoshizumi ............ G04G 17/045 |
| 2017/0181277 A1 * | 6/2017 | Tomita ................. H05K 1/038 |
| 2017/0256654 A1 * | 9/2017 | Yamazaki ........... H01L 27/1225 |
| 2017/0278920 A1 * | 9/2017 | Park ................. H10K 59/12 |
| 2017/0293171 A1 * | 10/2017 | Yamazaki ............. H10K 59/50 |
| 2017/0301699 A1 * | 10/2017 | Yamazaki ............. H01L 27/124 |
| 2017/0338108 A1 * | 11/2017 | Yamazaki ........ H01L 21/02483 |
| 2018/0046221 A1 * | 2/2018 | Choi ................. H05B 33/22 |
| 2018/0114825 A1 * | 4/2018 | Hong ................. H10K 77/10 |
| 2019/0280077 A1 * | 9/2019 | Park ................. H10K 59/131 |

FOREIGN PATENT DOCUMENTS

| | | |
|---|---|---|
| KR | 10-2017-0032955 | 3/2017 |
| KR | 10-2017-0100719 | 9/2017 |
| KR | 10-2017-0106621 | 9/2017 |
| KR | 10-2017-0136689 | 12/2017 |
| WO | 02/067329 | 8/2002 |

\* cited by examiner

STRETCHABLE DISPLAY DEVICE

CROSS-REFERENCE TO RELATED APPLICATION(S)

This is a continuation application of U.S. patent application Ser. No. 18/109,941, filed Feb. 15, 2023 (now pending), the disclosure of which is incorporated herein by reference in its entirety. U.S. patent application Ser. No. 18/109,941 is a continuation application of U.S. patent application Ser. No. 17/181,206, filed Feb. 22, 2021, now U.S. Pat. No. 11,594,591, issued Feb. 28, 2023, the disclosure of which is incorporated herein by reference in its entirety. U.S. patent application Ser. No. 17/181,206 is a continuation application of U.S. patent application Ser. No. 16/261,922, filed Jan. 30, 2019, now U.S. Pat. No. 10,964,769, issued Mar. 30, 2021, the disclosure of which is incorporated herein by reference in its entirety. U.S. patent application Ser. No. 16/261,922 claims priority to and benefits of Korean Patent Application No. 10-2018-0027477 under 35 U.S.C. § 119, filed Mar. 8, 2018, in the Korean Intellectual Property Office, the entire contents of which are incorporated herein by reference for all purposes.

BACKGROUND

1. Field

Embodiments relate to a stretchable display device.

2. Description of the Related Art

Generally, as examples of display devices, there are an organic light emitting diode (OLED) display, a liquid crystal display (LCD), and a plasma display panel (PDP). Among them, the organic light emitting diode (OLED) display includes a substrate and an organic light emitting diode provided on the substrate. Recently, a stretchable display device including a stretchable substrate and an organic light emitting element disposed on the stretchable substrate has been developed.

SUMMARY

Embodiments are directed to a stretchable display device including a stretchable substrate including a plurality of island areas that are separated from each other and a hinge area connecting the plurality of island areas, a plurality of display units respectively located in each of the plurality of island areas, a wiring part connecting the plurality of display units and located at the hinge area, and an insulating layer between the stretchable substrate and the plurality of display units. The insulating layer includes an opening overlapping the hinge area.

The wiring part may pass through the opening.

The insulating layer may further include an inorganic insulating layer on the stretchable substrate and an organic insulating layer on the inorganic insulating layer. The opening may be provided in the inorganic insulating layer.

The organic insulating layer may cover the opening.

The wiring part overlapping the opening may be located between the stretchable substrate and the organic insulating layer.

The display unit may include a thin film transistor on the stretchable substrate; and an organic light emitting element connected to the thin film transistor.

The thin film transistor may include an active layer on the stretchable substrate, a gate electrode on the active layer, and a source electrode and a drain electrode on the gate electrode.

The wiring part may be on the same layer as the source electrode and the drain electrode.

The wiring part may be on the same layer as the gate electrode.

The insulating layer may further include a buffer layer between the stretchable substrate and the active layer, a gate insulating layer between the active layer and the gate electrode, a data insulating layer between the gate electrode and the source electrode and drain electrode, and a via insulating layer covering the source electrode and the drain electrode. The opening may penetrate at least one among the data insulating layer, the gate insulating layer, and the buffer layer.

The via insulating layer may cover the opening.

The opening may include a plurality of sub-openings. The plurality of sub-openings may be disposed at one hinge area.

The plurality of sub-openings may be formed of at least one shape among a cross, a slit, and a ladder in a plan view.

The stretchable substrate may further include a depressed part communicating with the opening.

The depressed part may overlap the hinge area.

Embodiments are also directed to a stretchable display device including a stretchable substrate including a plurality of island areas that are separated from each other and a hinge area connecting the plurality of island areas, a plurality of display units respectively located in each of the plurality of island areas, and a wiring part connecting the plurality of display units and located at the hinge area. The stretchable substrate includes a depressed part overlapping the hinge area.

The wiring part may pass through the depressed part.

The stretchable display device may further include an insulating layer located between the stretchable substrate and the plurality of display units.

The insulating layer may include an organic insulating layer covering the depressed part.

The insulating layer may further include an inorganic insulating layer including an opening communicating with the depressed part.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
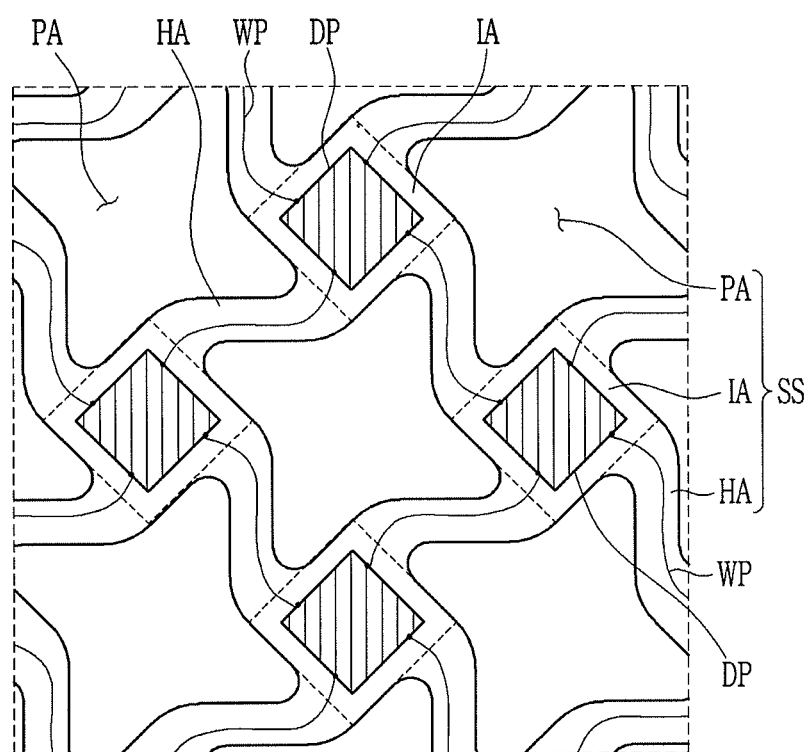
FIG. 1 illustrates a top plan view showing a part of a stretchable display device according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Further, in the specification, the words "on" or "above" may indicate disposed on or below the object portion, and do not necessarily mean disposed on the upper side of the object portion based on a gravitational direction.

Hereinafter, as an example of the stretchable display device, and a stretchable organic light emitting diode display is described. The stretchable display device may be various stretchable display devices that include a stretchable substrate and a display unit displaying an image.

FIG. 1 illustrates a top plan view showing a part of a stretchable display device according to an exemplary embodiment.

Referring to FIG. 1, a stretchable display device 1000 according to an exemplary embodiment may include a stretchable substrate SS, a display unit DP, and a wiring part WP.

The stretchable substrate SS may include a polymer such as polyimide, polyethylene, polypropylene, etc. The stretchable substrate SS may include an island area IA, a hinge area HA, and a penetration area PA.

A plurality of island areas IA may be disposed. The plurality of island areas IA may be separated from each other. Each island area IA may have various planar shapes such as a triangle, a pentagon, a hexagon, a polygon, a circle, an ellipse, and a closed loop type. For example, each island shape may have a planar square shape.

The hinge area HA may connect the adjacent island areas IA among the plurality of island areas IA. The hinge area HA may be integrally formed with the island area IA, and may extend from one island area IA to another island area IA. The hinge area HA may have, for example, a bent shape that is curved in a plan view.

The penetration area PA may be enclosed by the island area IA and the hinge area HA. The penetration area PA may be, for example, a part where the stretchable substrate SS is depressed or penetrated.

The display unit DP may display an image. The display unit DP may include a pixel as a minimum unit for displaying the image. A plurality of display units DP may be disposed. Each of the plurality of display units DP may be disposed at corresponding ones of the plurality of island areas IA.

The wiring part WP may connect between the plurality of display units DP. The wiring part WP may be disposed in the hinge area HA and may extend from one island area IA to another island area IA through the wiring part WP.

The wiring part WP may extend with a straight line shape or with a curved line shape that is curved along the hinge area HA, as examples.

An example of the display unit DP and the wiring part WP shown in FIG. 1 is described with reference to FIG. 2.

Figure 2:
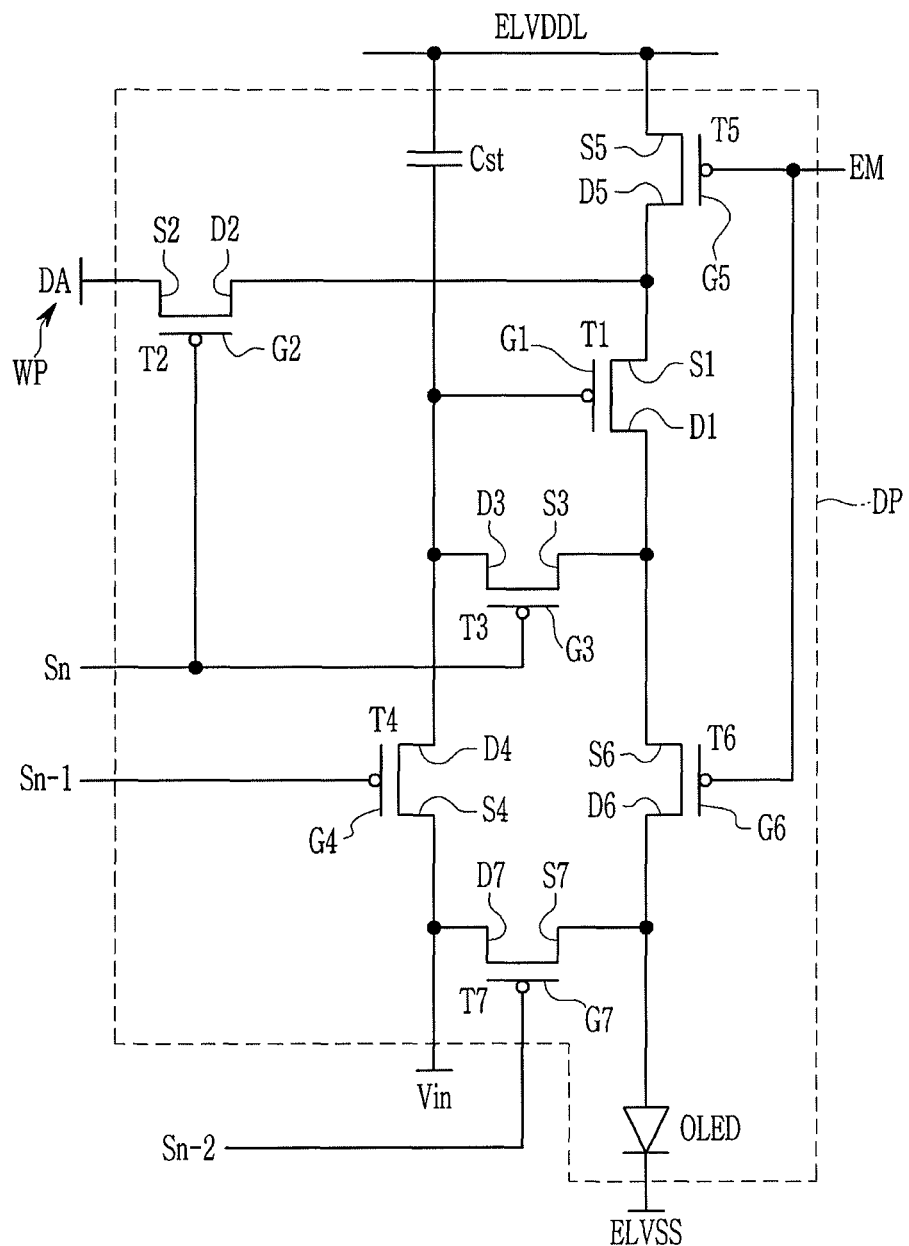
FIG. 2 illustrates a circuit diagram showing a display unit of FIG. 1.

FIG. 2 is a circuit diagram showing a display unit shown in FIG. 1.

The display unit DP may include a plurality of thin film transistors T1, T2, T3, T4, T5, T6, and T7, a capacitor Cst, and an organic light emitting element OLED, which are connected to the wiring part WP. The wiring part WP may include a plurality of lines Sn, S(n−1), S(n−2), EM, Vin, DA, and ELVDDL.

The plurality of thin film transistors T1, T2, T3, T4, T5, T6, and T7 may include a first thin film transistor T1, a second thin film transistor T2, a third thin film transistor T3, a fourth thin film transistor T4, a fifth thin film transistor T5, a sixth thin film transistor T6, and a seventh thin film transistor T7.

A first gate electrode G1 of the first thin film transistor T1 may be respectively connected to a third drain electrode D3 of the third thin film transistor T3 and a fourth drain electrode D4 of the fourth thin film transistor T4. A first source electrode S1 thereof may be respectively connected to a second drain electrode D2 of the second thin film transistor T2 and a fifth drain electrode D5 of the fifth thin film transistor T5. A first drain electrode D1 thereof may be respectively connected to a third source electrode S3 of the third thin film transistor T3 and a sixth source electrode S6 of the sixth thin film transistor T6.

A second gate electrode G2 of the second thin film transistor T2 may be connected to a first scan line Sn. A second source electrode S2 thereof may be connected to a data line DA. A second drain electrode D2 may be connected to the first source electrode S1 of the first thin film transistor T1.

A third gate electrode G3 of the third thin film transistor T3 may be connected to the first scan line Sn. A third source electrode S3 thereof may be connected to the first drain electrode D1 of the first thin film transistor T1. A third drain electrode D3 thereof may be connected to the first gate electrode G1 of the first thin film transistor T1.

A fourth gate electrode G4 of the fourth thin film transistor T4 may be connected to a second scan line S(n−1). A fourth source electrode S4 thereof may be connected to an initialization power line Vin. A fourth drain electrode D4 thereof may be connected to the first gate electrode G1 of the first thin film transistor T1.

A fifth thin film transistor T5 of the fifth gate electrode G5 may be connected to a light emission control line EM. A fifth source electrode S5 thereof may be connected to a driving power line ELVDDL. A fifth drain electrode D5 thereof may be connected to the first source electrode S1 of the first thin film transistor T1.

A sixth gate electrode G6 of the sixth thin film transistor T6 may be connected to a light emission control line EM. A sixth source electrode S6 thereof may be connected to the first drain electrode D1 of the first thin film transistor T1.

A seventh gate electrode G7 of the seventh thin film transistor T7 may be connected to a third scan line S(n-2). A seventh source electrode S7 thereof may be connected to the organic light emitting element OLED. A seventh drain electrode D7 thereof may be connected to the fourth source electrode S4 of the fourth thin film transistor T4.

The wiring part WP may include the first scan line Sn transmitting a first scan signal to each of the second gate electrode G2 and the third gate electrode G3 of the second thin film transistor T2 and the third thin film transistor T3, the second scan line S(n-1) transmitting a second scan signal to the fourth gate electrode G4 of the fourth thin film transistor T4, the third scan line S(n-2) transmitting a third scan signal to the seventh gate electrode G7 of the seventh thin film transistor T7, the light emission control line EM transmitting a light emission control signal to each of the fifth gate electrode G5 and the sixth gate electrode G6 of the fifth thin film transistor T5 and the sixth thin film transistor T6, the data line DA transmitting a data signal to the second source electrode S2 of the second thin film transistor T2, the driving power line ELVDDL supplying a driving power to each of one electrode of the capacitor Cs and the fifth source electrode S5 of the fifth thin film transistor T5, and the initialization power line Vin supplying an initialization signal to the fourth source electrode S4 of the fourth thin film transistor T4.

The capacitor Cst may include one electrode connected to the driving power line ELVDDL and another electrode connected to each of the first gate electrode G1 and the third drain electrode D3 of the third thin film transistor T3.

The organic light emitting element OLED may include a first electrode, a second electrode on the first electrode, and an organic emission layer between the second electrode and the first electrode. The first electrode of the organic light emitting element OLED may be respectively connected to the seventh source electrode S7 of the seventh thin film transistor T7 and the sixth drain electrode D6 of the sixth thin film transistor T6. The second electrode thereof may be connected to a common power line ELVSS to which a common power is supplied.

In some implementations, the display unit DP may include the plurality of thin film transistors including the first thin film transistor T1 to the seventh thin film transistor T7, the capacitor Cst, and the organic light emitting element OLED. In some implementations, the display unit DP may include at least two thin film transistors, at least one capacitor, and the organic light emitting element.

The wiring part WP may include various disclosed signal lines. For example, the wiring part WP may include the first scan line Sn, the second scan line S(n-1), the third scan line S(n-2), the light emission control line EM, the data line DA, the driving power line ELVDDL, and the initialization power line Vin.

Insulating layers may be disposed between configurations included in the above-described display unit DP and between configurations included in the wiring part WP.

A stacking order of the stretchable display device according to an exemplary embodiment is described with reference to FIG. 3.

Figure 3:
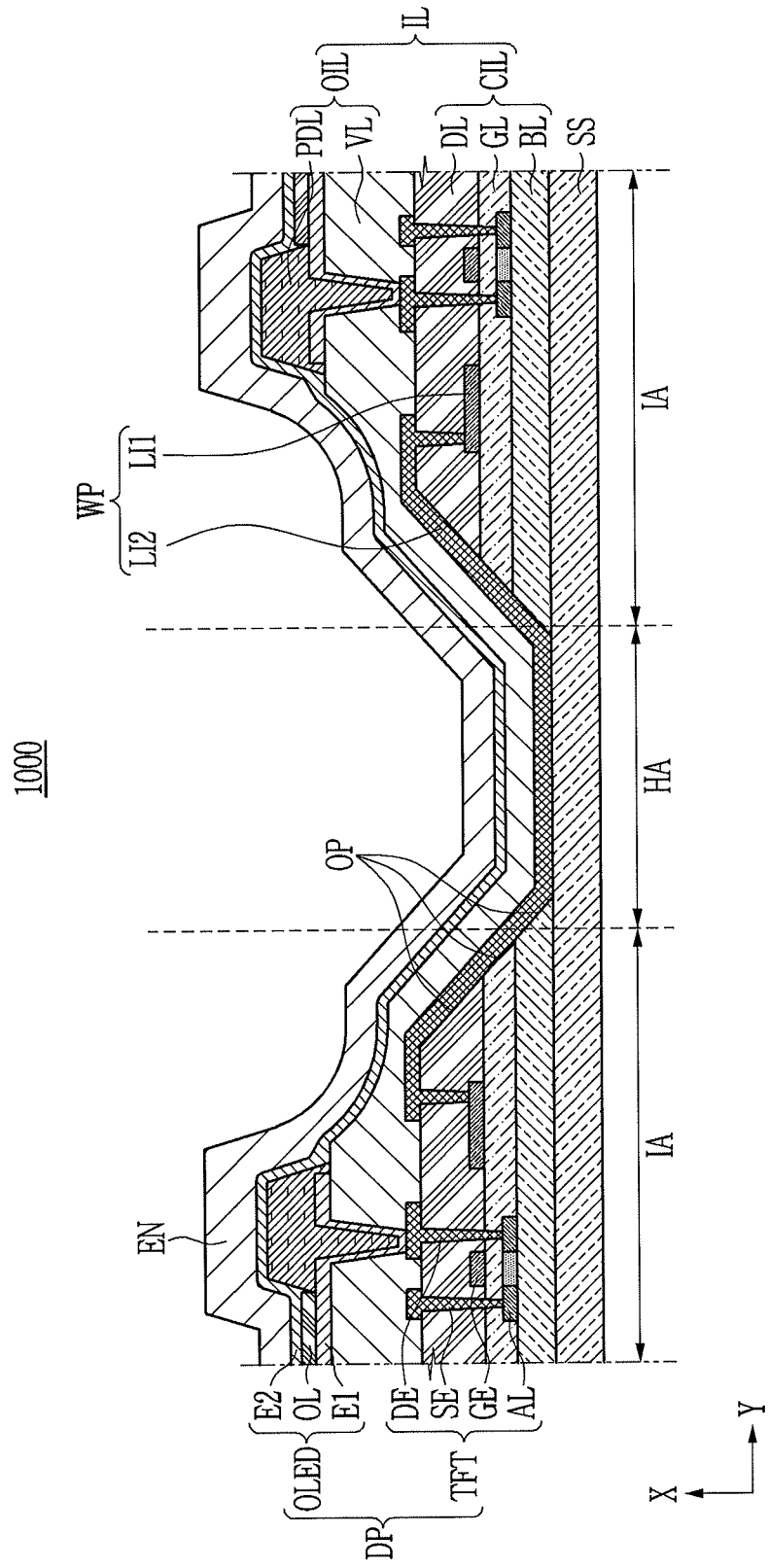
FIG. 3 illustrates a cross-sectional view showing a stretchable display device according to an exemplary embodiment.

FIG. 3 illustrates a cross-sectional view showing a stretchable display device according to an exemplary embodiment. For example, FIG. 3 illustrates the cross-sectional view showing the cross-section of the stretchable display device corresponding to the island area and the hinge area of the stretchable substrate shown in FIG. 1.

Referring to FIG. 3, the stretchable display device 1000 according to an exemplary embodiment includes a stretchable substrate SS, the display unit DP, an insulating layer IL, the wiring part WP, and an encapsulation layer EN stacked along a first direction X.

The stretchable substrate SS may include the plurality of island areas IA that are spaced apart from each other along a second direction Y, and the hinge area HA connecting the plurality of island areas IA.

For example, the hinge area may be between adjacent island areas IA.

The display unit DP may include the thin film transistor TFT disposed on the island area IA of the stretchable substrate SS and the organic light emitting element OLED connected to the thin film transistor TFT stacked along the first direction X.

The thin film transistor TFT may include an active layer AL, a gate electrode GE, a source electrode SE, and a drain electrode DE. The thin film transistor TFT may be one among the first thin film transistor TFT to the seventh thin film transistor TFT described in FIG. 2. The active layer AL, the gate electrode GE, the source electrode SE, and the drain electrode DE may have the various disclosed structures.

The organic light emitting element OLED may include the first electrode E1 connected to the thin film transistor TFT, the organic emission layer OL on the first electrode E1, and the second electrode E2 on the organic emission layer OL.

At least one electrode of the first electrode E1 and the second electrode E2 may be one among a light transmitting electrode, a light reflective electrode, and a light translucent electrode. The light emitted from the organic emission layer OL may be emitted in at least one electrode direction of the first electrode E1 and the second electrode E2.

The first electrode E1 may be connected to the thin film transistor TFT. The part of the first electrode E1 may be opened by an opening of a pixel definition layer PDL. The opening of the pixel definition layer PDL may overlap at least part of the first electrode E1.

The second electrode E2 extend from the island area IA of the stretchable substrate SS to the hinge area HA. The second electrode E2 may be connected to the common power line ELVSS shown in FIG. 2.

The insulating layer IL may be disposed between the stretchable substrate SS and the display unit DP. The insulating layer IL may prevent a short circuit between the configurations included in the display unit DP.

The insulating layer IL may include an inorganic insulating layer CIL and an organic insulating layer OIL.

The inorganic insulating layer CIL may be disposed on the stretchable substrate SS. The inorganic insulating layer CIL may include an inorganic material including at least one of a silicon oxide and a silicon nitride. The inorganic insulating layer CIL may include a buffer layer BL, a gate insulating layer GL, a data insulating layer DL, and an opening OP.

The buffer layer BL may be disposed between the stretchable substrate SS and the active layer AL. The gate insulating layer GL may be disposed between the active layer AL and the gate electrode GE. The data insulating layer DL may be disposed between the gate electrode GE, and the source electrode SE and drain electrode DE.

In some implementations, the opening OP may overlap the hinge area HA and penetrate the data insulating layer DL, the gate insulating layer GL, and the buffer layer BL along the stacking direction, i.e., the first direction X. The opening OP may expose the surface of the hinge area HA of the stretchable substrate SS.

In some implementations, the opening OP may penetrate at least one among the data insulating layer DL, the gate insulating layer GL, and the buffer layer BL.

The organic insulating layer OIL may be disposed on the inorganic insulating layer CIL. The organic insulating layer OIL may include the organic material including at least one among polyimide, phenylene, siloxane, or the like. The organic insulating layer OIL may include a via insulating layer VL and the pixel definition layer PDL.

The via insulating layer VL may cover the source electrode SE and the drain electrode DE and may be disposed between the source electrode SE, and the drain electrode DE and first electrode E1. The organic insulating layer OIL may cover the opening OP included in the inorganic insulating layer CIL overlapping the hinge area HA. For example, the via insulating layer VL may cover the opening OP included in the inorganic insulating layer CIL overlapping the hinge area HA.

In some implementations, the pixel definition layer PDL may cover an end part of the first electrode E1.

In some implementations, the pixel definition layer PDL may cover the opening OP included in the inorganic insulating layer CIL.

The wiring part WP may connect the display units DP disposed on the adjacent island areas IA through the hinge area HA. The wiring part WP may include at least one among the first scan line Sn, the second scan line S(n−1), the third scan line S(n−2), the light emission control line EM, the data line DA, the driving power line ELVDDL, and the initialization power line Vin shown in FIG. 2.

The wiring part WP may be in the opening OP overlapping the hinge area HA. The wiring part WP may have a shape that is depressed along the opening OP in the hinge area HA. The wiring part WP overlapping the opening OP may be disposed between the stretchable substrate SS and the via insulating layer VL included in the organic insulating layer OIL. The wiring part WP overlapping the opening OP may be in direct contact with the stretchable substrate SS and the organic insulating layer OIL.

The wiring part WP may include a first line LI1 overlapping the island area IA, and a second line LI2 bridge-connected to the first line LI1 through a contact hole of the data insulating layer DL and overlapping the hinge area HA.

The first line LI1 may be disposed on the same layer as the gate electrode GE, and may include the same material as the gate electrode GE. The second line LI2 may be disposed on the same layer as the source electrode SE and the drain electrode DE, and may include the same material as the source electrode SE and the drain electrode DE.

The encapsulation layer EN may be disposed on the stretchable substrate SS via the display unit DP, the insulating layer IL, and the wiring part WP. The encapsulation layer EN may include at least one inorganic layer and at least one organic layer. The encapsulation layer EN disposed at the hinge area HA of the stretchable substrate SS may cover the opening OP and may have the depressed shape.

As above-described, in the stretchable display device 1000 according to an exemplary embodiment, the insulating layer IL disposed on the stretchable substrate SS may include the opening OP overlapping the hinge area HA. Even if the stretchable substrate SS is elongated such that stress is applied to the hinge area HA, the insulating layer IL may be prevented from being damaged in the hinge area HA.

In the stretchable display device 1000 according to an exemplary embodiment, the inorganic insulating layer CIL disposed on the stretchable substrate SS and having brittleness may include the opening OP overlapping the hinge area HA. Even if the stretchable substrate SS is elongated such that stress is applied to the hinge area HA, the inorganic insulating layer CIL may be prevented from being damaged in the hinge area HA.

In the stretchable display device 1000 according to an exemplary embodiment, the wiring part WP connecting the display units DP may pass through the opening OP of the insulating layer IL overlapping the hinge area HA of the stretchable substrate SS. Even if the stretchable substrate SS is elongated such that stress is applied to the hinge area HA, damage of the insulating layer IL may not be generated in the hinge area HA, and damage to the wiring part WP overlapping the hinge area HA may be reduced or prevented.

In the stretchable display device 1000 according to an exemplary embodiment, the wiring part WP overlapping the hinge area HA may be in direct contact with the stretchable substrate SS and the organic insulating layer OIL between the stretchable substrate SS and the organic insulating layer OIL. Even if the stretchable substrate SS is elongated such that stress is applied to the hinge area HA, the shape of the stretchable substrate SS and the organic insulating layer OIL may be deformed corresponding to the stress such that the stress may be dispersed and damage to wiring part WP overlapping the hinge area HA may be reduced or prevented.

For example, the stretchable display device 1000 in which damage to the wiring part WP connecting the display units DP is reduced or prevented, even if the stretchable substrate SS is elongated, is provided.

A stretchable display device according to an exemplary embodiment is described with reference to FIG. 4.

Hereinafter, differences from the above-described exemplary embodiment are mainly described.

Figure 4:
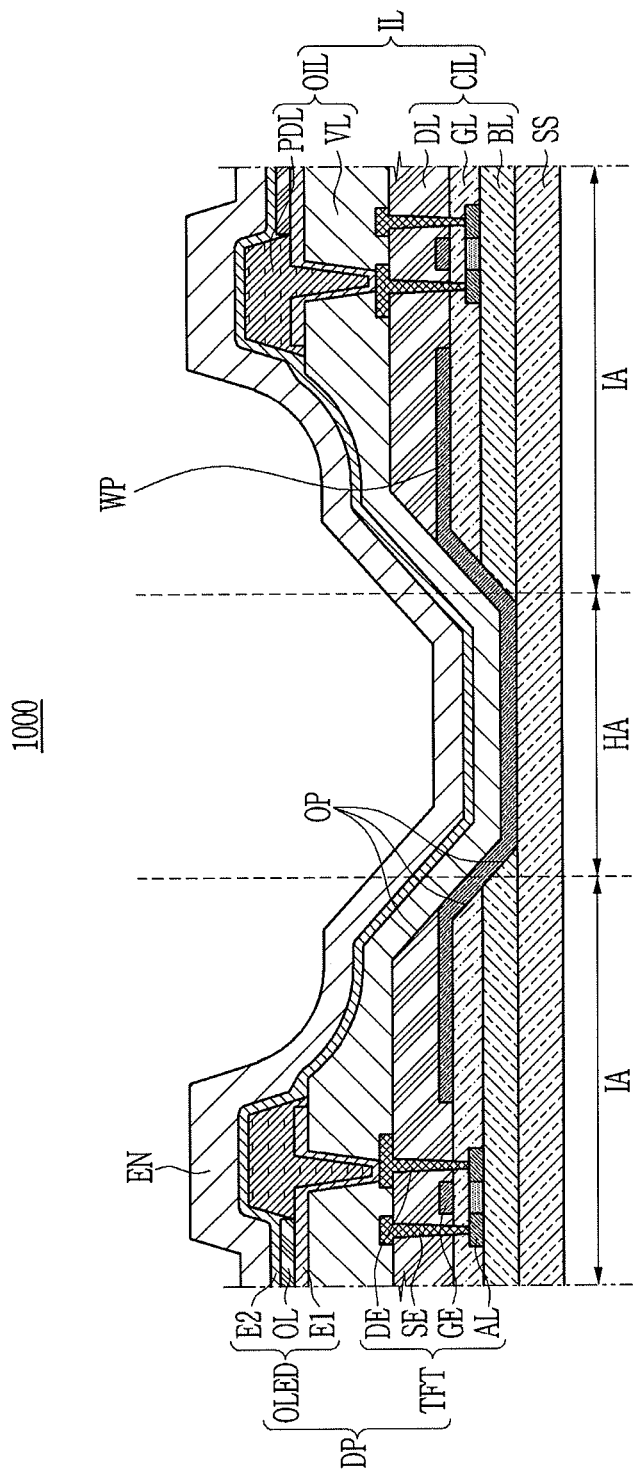
FIG. 4 illustrates a cross-sectional view showing a stretchable display device according to another exemplary embodiment.

FIG. 4 illustrates a cross-sectional view showing a stretchable display device according to an exemplary embodiment.

Referring to FIG. 4, the stretchable display device 1000 according to the current exemplary embodiment may include the stretchable substrate SS, the display unit DP, the insulating layer IL, the wiring part WP, and the encapsulation layer EN.

The wiring part WP may connect the display units DP disposed on the adjacent island areas IA through the hinge area HA. The wiring part WP may pass through the opening OP overlapping the hinge area HA. The wiring part WP may have a shape that is depressed along the opening OP in the hinge area HA. The wiring part WP overlapping the opening OP may be disposed between the stretchable substrate SS and the via insulating layer VL included in the organic insulating layer OIL. The wiring part WP overlapping the opening OP may be in direct contact with the stretchable substrate SS and the organic insulating layer OIL.

The wiring part WP may extend as one layer from one island area IA to the other island area IA through the hinge area HA. The wiring part WP may be disposed on the same layer as the gate electrode GE and may include the same material as the gate electrode GE.

In the stretchable display device 1000 according to the current exemplary embodiment, the inorganic insulating layer CIL disposed on the stretchable substrate SS may include the opening OP overlapping the hinge area HA and the wiring part WP may pass through the opening OP of the inorganic insulating layer CIL overlapping the hinge area HA of the stretchable substrate SS. Even if the stretchable substrate SS extends such that stress is applied to the hinge area HA, the damage of the inorganic insulating layer CIL may not be generated in the hinge area HA, and damage to the wiring part WP overlapping the hinge area HA may be reduced or prevented.

In the stretchable display device 1000 according to an exemplary embodiment, the wiring part WP overlapping the hinge area HA may be in direct contact with the stretchable substrate SS and the organic insulating layer OIL between the stretchable substrate SS and the organic insulating layer OIL. Even if the stretchable substrate SS is elongated such that stress is applied to the hinge area HA, the shape of the stretchable substrate SS and the organic insulating layer OIL may be deformed corresponding to the stress such that the stress is dispersed, and damage to the wiring part WP overlapping the hinge area HA may be reduced or prevented.

For example, the stretchable display device 1000 in which damage to the wiring part WP connecting the display units DP is reduced or prevented, even if the stretchable substrate SS is elongated, is provided.

A stretchable display device according to an exemplary embodiment is described with reference to FIG. 5 and FIG. 6.

Figure 5:
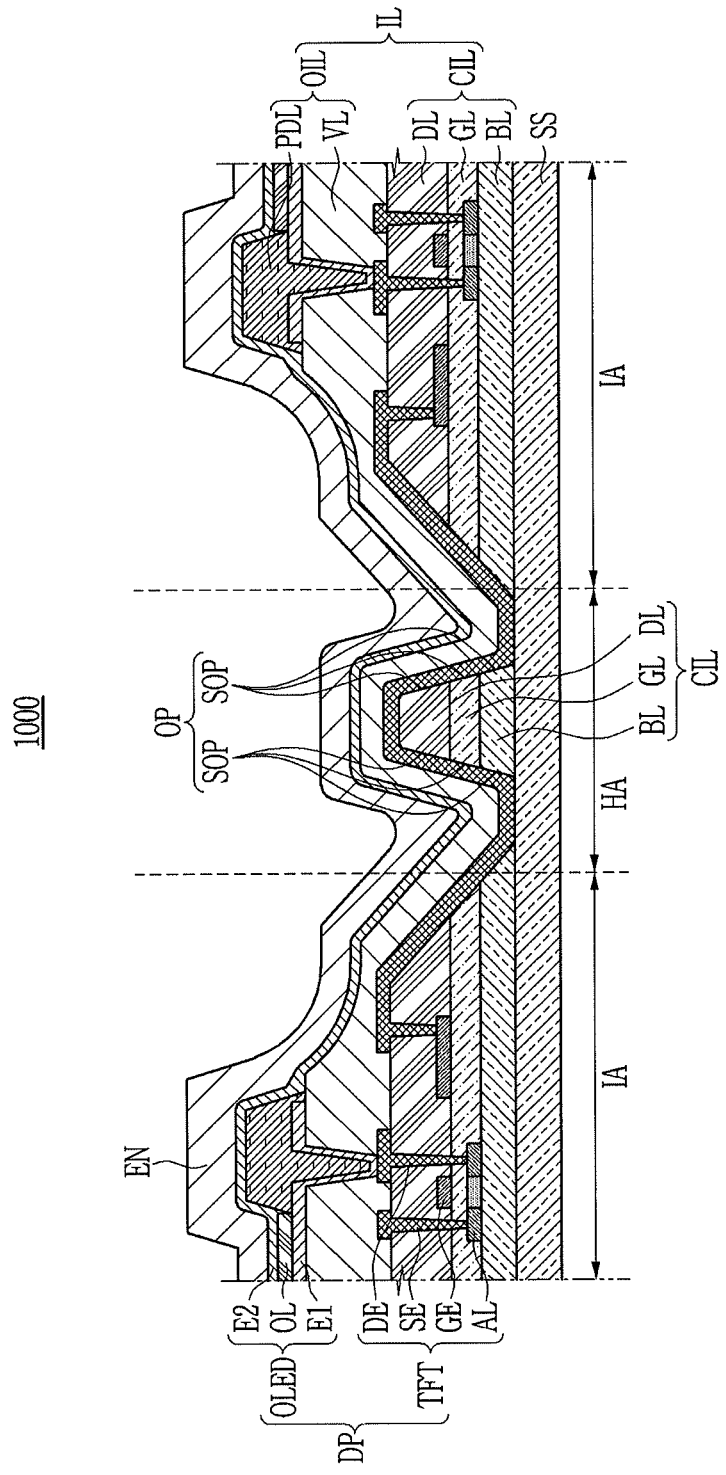
FIG. 5 illustrates a cross-sectional view showing a stretchable display device according to another exemplary embodiment.

FIG. 5 illustrates a cross-sectional view showing a stretchable display device according to an exemplary embodiment.

Referring to FIG. 5, the stretchable display device 1000 according to an exemplary embodiment may include the stretchable substrate SS, the display unit DP, the insulating layer IL, the wiring part WP, and the encapsulation layer EN.

The opening OP of the insulating layer IL may include a plurality of sub-openings SOP.

The plurality of sub-openings SOP may be disposed in one hinge area HA.

The inorganic insulating layer CIL may be disposed between the plurality of sub-openings SOP, and the wiring part WP and the organic insulating layer OIL may cover the plurality of sub-openings SOP and the inorganic insulating layer CIL between the plurality of sub-openings SOP.

The plurality of sub-openings SOP included in the opening OP may be formed in various shapes in a plan view.

FIG. 6 illustrates a top plan view showing a series of examples of a plan shape of an opening shown in FIG. 5.

Figure 6A:
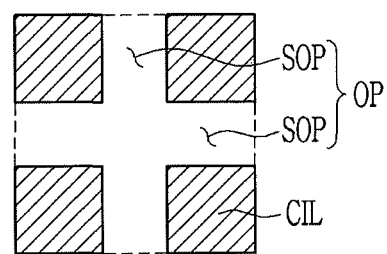
FIG. 6A illustrates a top plan view showing an example of a plan shape of the opening shown in FIG. 5.

Referring to FIG. 6A, the plurality of sub-openings SOP may form a cross shape in a plan view. The inorganic insulating layer CIL may be disposed between the plurality of sub-openings SOP.

Figure 6B:
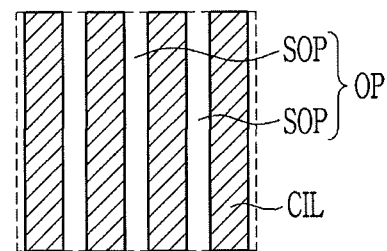
FIG. 6B illustrates a top plan view showing an example of a plan shape of the opening shown in FIG. 5.

Referring to FIG. 6B, the plurality of sub-openings SOP may form a slit shape in a plan view. The inorganic insulating layer CIL may be disposed between the plurality of sub-openings SOP.

Figure 6C:
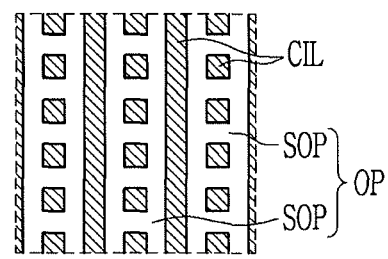
FIG. 6C illustrates a top plan view showing an example of a plan shape of the opening shown in FIG. 5.

Referring to FIG. 6C, the plurality of sub-openings SOP may form a ladder shape in a plan view. The inorganic insulating layer CIL may be disposed between the plurality of sub-openings SOP.

As above-described, in the stretchable display device 1000 according to the current exemplary embodiment, the inorganic insulating layer CIL disposed on the stretchable substrate SS may include the opening OP including the plurality of sub-openings SOP overlapping the hinge area HA, and the wiring part WP may pass through the plurality of sub-openings SOP of the opening OP of the inorganic insulating layer CIL overlapping the hinge area HA of the stretchable substrate SS. Even if the stretchable substrate SS extends such that stress is applied to the hinge area HA, damage to the inorganic insulating layer CIL may not be generated in the hinge area HA, and damage to the wiring part WP overlapping the hinge area HA may be reduced or prevented.

In the stretchable display device 1000 according to an exemplary embodiment, the wiring part WP overlapping the hinge area HA may be in direct contact with the stretchable substrate SS and the organic insulating layer OIL between the stretchable substrate SS and the organic insulating layer OIL. Even if the stretchable substrate SS is elongated such that stress is applied to the hinge area HA, the shape of the stretchable substrate SS and the organic insulating layer OIL may be deformed corresponding to the stress such that the stress may be dispersed, and damage to the wiring part WP overlapping the hinge area HA may be reduced or suppressed.

For example, the stretchable display device 1000 in which damage to the wiring part WP connecting the display units DP is reduced or prevented, even if the stretchable substrate SS is elongated, is provided.

The stretchable display device according to another exemplary embodiment is described with reference to FIG. 7.

Figure 7:
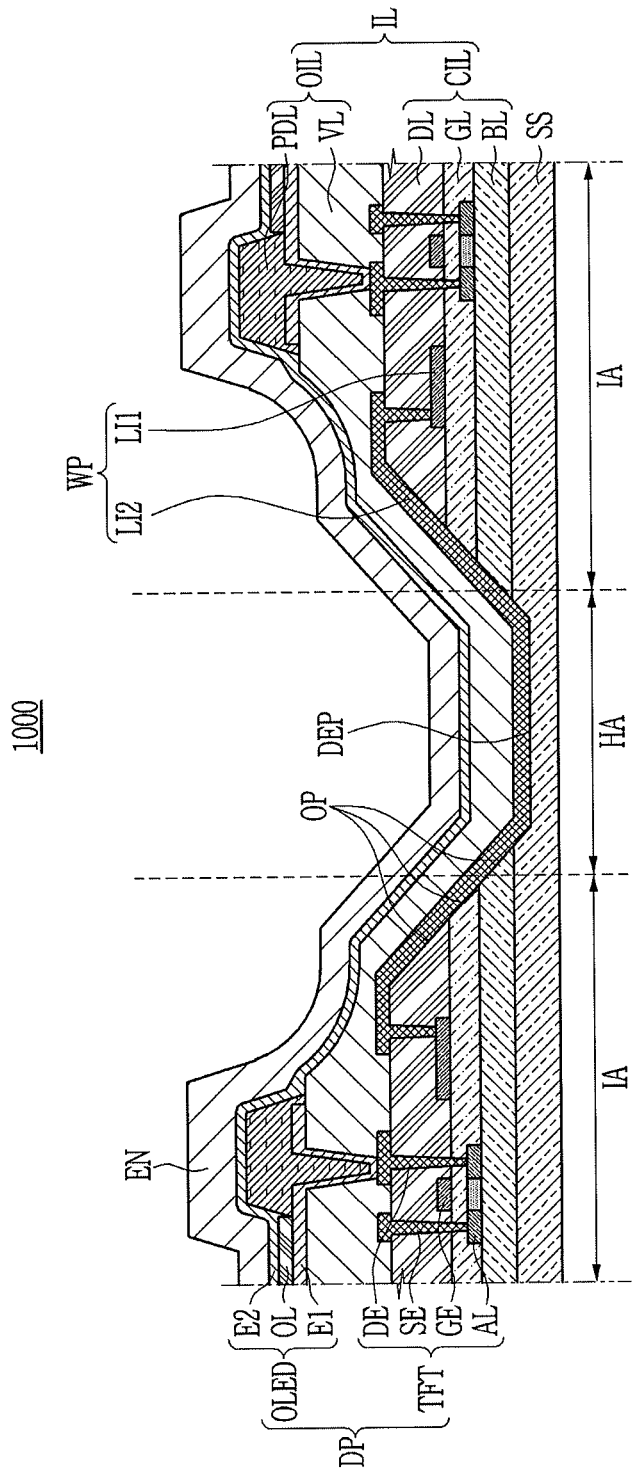
FIG. 7 illustrates a cross-sectional view showing a stretchable display device according to another exemplary embodiment.

FIG. 7 illustrates a cross-sectional view showing a stretchable display device according to an exemplary embodiment.

Referring to FIG. 7, the stretchable display device 1000 according to an exemplary embodiment may include the stretchable substrate SS, the display unit DP, the insulating layer IL, the wiring part WP, and the encapsulation layer EN.

The stretchable substrate SS may include the plurality of island areas IA that are separated from each other, the hinge area HA connecting the plurality of island areas IA, and a depressed part DEP.

The depressed part DEP may communicate with the opening OP of the insulating layer IL. The depressed part DEP may overlap the hinge area HA. The depressed part DEP may have a shape that is depressed from the surface of the hinge area HA.

The organic insulating layer OIL of the insulating layer IL may cover the opening OP included in the inorganic insulating layer CIL and the depressed part DEP included in the stretchable substrate SS.

The wiring part WP may pass through the opening OP overlapping the hinge area HA and the depressed part DEP. The wiring part WP may have the shape that is depressed along the opening OP and the depressed part DEP in the hinge area HA. The wiring part WP overlapping the opening OP and the depressed part DEP may be disposed between the stretchable substrate SS and the via insulating layer VL included in the organic insulating layer OIL. The wiring part WP overlapping the opening OP and the depressed part DEP may be in direct contact with the stretchable substrate SS and the organic insulating layer OIL.

The encapsulation layer EN disposed at the hinge area HA of the stretchable substrate SS may cover the opening OP and the depressed part DEP and may have the depressed shape.

As above-described, in the stretchable display device 1000 according to the current exemplary embodiment, the inorganic insulating layer CIL disposed on the stretchable substrate SS may include the opening OP overlapping the hinge area HA, the stretchable substrate SS may include the depressed part DEP communicated with the opening OP, and the wiring part WP may pass through the opening OP of the inorganic insulating layer CIL overlapping the hinge area HA of the stretchable substrate SS and the depressed part DEP of the stretchable substrate SS. Even if the stretchable substrate SS extends such that stress is applied to the hinge area HA, the damage of the inorganic insulating layer CIL may not be generated in the hinge area HA, and damage to the wiring part WP overlapping the hinge area HA may be reduced or prevented.

In the stretchable display device 1000 according to the current exemplary embodiment, the wiring part WP overlapping the hinge area HA may be in direct contact with the stretchable substrate SS and the organic insulating layer OIL between the stretchable substrate SS and the organic insulating layer OIL. Even if the stretchable substrate SS is elongated such that stress is applied to the hinge area HA, the stretchable substrate SS including the depressed part DEP and the organic insulating layer OIL may be deformed corresponding to the stress in the shape thereof such that the stress is dispersed, and damage to the wiring part WP overlapping the hinge area HA may be reduced or prevented.

The stretchable display device 1000 in which damage to the wiring part WP connecting the display units DP is reduced or prevented, even if the stretchable substrate SS is elongated, is provided.

By way of summation and review, a stretchable display device in which the wiring part connecting the adjacent display units is suppressed from being damaged even if the stretchable substrate expands, is provided.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. A display device, comprising:
    a substrate including a plurality of island areas that are separated from each other and a hinge area different from the plurality of island areas and connecting the plurality of island areas;
    an inorganic insulating layer on the substrate;
    an organic insulating layer on the inorganic insulating layer; and
    a plurality of display units on the substrate with each display unit located in a respective island area of the plurality of island areas,
    wherein a maximum thickness of an entirety of the substrate and the inorganic insulating layer in the island area in a first direction perpendicular to an upper surface of the substrate is greater than a maximum thickness of an entirety of the substrate and the inorganic insulating layer in the hinge area in the first direction.

2. The display device as claimed in claim 1, wherein a maximum thickness of the substrate in the island area in the first direction is greater than a maximum thickness of the substrate in the hinge area in the first direction.

3. The display device as claimed in claim 2, wherein a maximum thickness of the inorganic insulating layer in the island area in the first direction is greater than a maximum thickness of the inorganic insulating layer in the hinge area in the first direction.

4. The display device as claimed in claim 1, wherein a maximum thickness of the inorganic insulating layer in the island area in the first direction is greater than a maximum thickness of the inorganic insulating layer in the hinge area in the first direction.

5. The display device as claimed in claim 1, wherein the inorganic insulating layer has an opening overlapping the hinge area.

6. The display device as claimed in claim 5, wherein the inorganic insulating layer includes:
    a buffer layer on the substrate;
    a gate insulating layer on the buffer layer; and
    a data insulating layer on the gate insulating layer,
    wherein the opening penetrates at least one among the buffer layer, the gate insulating layer and the data insulating layer.

7. The display device as claimed in claim 5, further comprising: a wiring part electrically connecting the plurality of display units and extending from an island area of the plurality of island areas into the hinge area,
    wherein at least a portion of the wiring part in the hinge area overlaps the opening.

8. The display device as claimed in claim 7, wherein the wiring part in the hinge area contacts a side surface of the inorganic insulating layer forming the opening.

9. The display device as claimed in claim 7, wherein the wiring part overlapping the opening is located between the substrate and the organic insulating layer.

10. The display device as claimed in claim 5, wherein the organic insulating layer covers the opening.

11. The display device as claimed in claim 5, wherein
    the organic insulating layer includes a first portion disposed in the island area, and a second portion disposed in the hinge area, and
    a maximum thickness of the first portion of the organic insulating layer in the first direction is greater than a maximum thickness of the second portion of the organic insulating layer in the first direction.

12. The display device as claimed in claim 1, wherein the display unit includes:
    a thin film transistor on the substrate; and
    an organic light emitting element connected to the thin film transistor.

13. The display device as claimed in claim 12, wherein the thin film transistor includes:
    an active layer on the substrate;
    a gate electrode on the active layer; and
    a source electrode or a drain electrode on the gate electrode.

14. A display device, comprising:
    a substrate including a plurality of island areas that are separated from each other and a hinge area different from the plurality of island areas and connecting the plurality of island areas;
    an inorganic insulating layer on the substrate;
    an organic insulating layer on the inorganic insulating layer; and
    a plurality of display units on the substrate with each display unit located in a respective island area of the plurality of island areas,
    wherein a maximum thickness of the substrate in the island area in a first direction perpendicular to an upper surface of the substrate is greater than a maximum thickness of the substrate in the hinge area in the first direction.

15. The display device as claimed in claim 14, wherein the inorganic insulating layer has an opening overlapping the hinge area.

* * * * *